United States Patent
Pietsch et al.

(10) Patent No.: US 12,532,714 B2
(45) Date of Patent: Jan. 20, 2026

(54) METHOD FOR PRODUCING DISCS FROM A CYLINDRICAL ROD MADE OF A SEMICONDUCTOR MATERIAL

(71) Applicant: SILTRONIC AG, Munich (DE)

(72) Inventors: Georg Pietsch, Burghausen (DE); Joachim Junge, Burghausen (DE)

(73) Assignee: SILTRONIC AG, Munich (DE)

( * ) Notice: Subject to any disclaimer, the term of this patent is extended or adjusted under 35 U.S.C. 154(b) by 218 days.

(21) Appl. No.: 18/546,434

(22) PCT Filed: Feb. 4, 2022

(86) PCT No.: PCT/EP2022/052731
§ 371 (c)(1),
(2) Date: Aug. 15, 2023

(87) PCT Pub. No.: WO2022/175114
PCT Pub. Date: Aug. 25, 2022

(65) Prior Publication Data
US 2024/0136173 A1 Apr. 25, 2024
US 2024/0234125 A9 Jul. 11, 2024

(30) Foreign Application Priority Data

Feb. 18, 2021 (EP) .................................... 21157857

(51) Int. Cl.
*H01L 21/02* (2006.01)
*B24B 7/22* (2006.01)
(Continued)

(52) U.S. Cl.
CPC ........ *H01L 21/02019* (2013.01); *B24B 7/228* (2013.01); *B24D 7/06* (2013.01); *B28D 5/045* (2013.01); *B28D 7/02* (2013.01)

(58) Field of Classification Search
CPC ......... H01L 21/02019; H01L 21/02013; B24B 7/228; B24B 7/17; B24D 7/06;
(Continued)

(56) References Cited

U.S. PATENT DOCUMENTS 6,066,565 A    5/2000  Kuroki et al.
6,234,873 B1   5/2001  Yamamoto et al.
(Continued)

FOREIGN PATENT DOCUMENTS

DE         10142400 B4 *  9/2009  ....... H01L 21/02008
DE    102013219468 A1     3/2015
(Continued)

*Primary Examiner* — Duy Vu N Deo
(74) *Attorney, Agent, or Firm* — LEYDIG, VOIT & MAYER, LTD.

(57) ABSTRACT

A method produces wafers from a cylindrical ingot of semiconductor material having an axis and an indexing notch in an outer surface of the cylindrical ingot and parallel to the axis. The method includes, in the order specified: (a) simultaneous removal of a multiplicity of sliced wafers from the cylindrical ingot by multi-wire slicing in the presence of a cutting agent; (b) etching of the sliced wafers with an alkaline etchant in an etching bath at a temperature of 20° C. to 50° C. and for a residence time, such that the material removed from each of the sliced wafers is less than 5/1000 of an initial wafer thickness; and (c) grinding of the etched wafers by simultaneous double-disk grinding using an annular abrasive covering.

16 Claims, 4 Drawing Sheets

(51) Int. Cl.
  *B24D 7/06* (2006.01)
  *B28D 5/04* (2006.01)
  *B28D 7/02* (2006.01)

(58) Field of Classification Search
  CPC .......... B28D 5/045; B28D 7/02; B28D 1/124; B23D 61/185
  USPC .................................................. 438/690–693
  See application file for complete search history.

(56) References Cited

U.S. PATENT DOCUMENTS

| | | | |
|---|---|---|---|
| 6,376,335 | B1 | 4/2002 | Zhang et al. |
| 6,376,395 | B2 | 4/2002 | Vasat et al. |
| 6,491,836 | B1 | 12/2002 | Kato et al. |
| 2002/0016072 | A1 | 2/2002 | Hashii et al. |
| 2003/0060050 | A1 | 3/2003 | Pietsch et al. |
| 2006/0252272 | A1 | 11/2006 | Koyata et al. |
| 2009/0203212 | A1 | 8/2009 | Ichikawa et al. |
| 2011/0163326 | A1 | 7/2011 | Matsumoto |
| 2011/0183582 | A1 | 7/2011 | Schwandner et al. |
| 2011/0250762 | A1* | 10/2011 | Barr .................. H01L 21/02052 252/79.5 |
| 2015/0083104 | A1 | 3/2015 | Pietsch |
| 2015/0314484 | A1* | 11/2015 | Pietsch .................. B28D 5/045 125/21 |
| 2016/0184909 | A1* | 6/2016 | Rezvanian ........... B23D 61/185 125/21 |
| 2020/0316817 | A1 | 10/2020 | Rieger et al. |
| 2022/0234250 | A1 | 7/2022 | Pietsch et al. |

FOREIGN PATENT DOCUMENTS

| | | |
|---|---|---|
| DE | 102016211883 A1 | 1/2018 |
| EP | 1049145 A1 | 11/2000 |
| EP | 1193029 B1 | 8/2005 |
| EP | 1827745 A1 | 9/2007 |
| JP | 2008274050 A | 11/2008 |
| JP | 2010087486 A | 4/2010 |
| JP | 2010161191 A * | 7/2010 |
| JP | 2011129569 A | 6/2011 |
| JP | 2013045909 A | 3/2013 |
| JP | 2015030071 A | 2/2015 |
| JP | 2015207768 A | 11/2015 |
| KR | 20160069512 A | 6/2016 |
| TW | 202042941 A | 12/2020 |
| WO | 2006067062 A1 | 6/2006 |

* cited by examiner

METHOD FOR PRODUCING DISCS FROM A CYLINDRICAL ROD MADE OF A SEMICONDUCTOR MATERIAL

CROSS REFERENCE TO RELATED APPLICATIONS

This application is a U.S. National Phase application under 35 U.S.C. § 371 of International Application No. PCT/EP2022/052731, filed on Feb. 4, 2022, and claims benefit to European Patent Application No. EP 21157857.0, filed on Feb. 18, 2021. The International Application was published in German on Aug. 25, 2022 as WO 2022/175114 A1 under PCT Article 21(2).

FIELD

The present disclosure pertains to a method for producing wafers from a cylindrical ingot of semiconductor material, which includes the removal of the wafers from the ingot by means of wire slicing and the double-sided grinding of the wafers.

BACKGROUND

A multiplicity of applications require uniform wafers having good plane-parallelism of front side and back side, which have a low count of crystalline and structural defects. One example are wafers of monocrystalline semiconductor material for the patterning of microelectronic components. One example of semiconductor material is silicon. Such wafers are obtained by removal from a cylindrical workpiece (ingot) of monocrystalline silicon and are subjected to mechanical working. The removal is accomplished frequently by means of multi-wire slicing (MWS) and the mechanical working by means of simultaneous double-disk grinding (DDG).

A method and an apparatus for multi-wire slicing are known from, for example, DE 10 2016 211 883 A1 or DE 10 2013 219 468 A1. In multi-wire slicing, a wire is guided spirally around at least two wire-guiding rollers in such a way that two wire-guiding rollers accommodate a tensioned web, facing the workpiece, of wire sections extending parallel to one another. The wire-guiding rollers have the shape of straight circular cylinders with axes which are oriented parallel to one another and about which they may be rotated. The lateral surfaces of the wire-guiding rollers carry a multiplicity of circularly closed grooves which extend in planes perpendicular to the axes, these grooves guiding the wire. Codirectional rotation of the wire-guiding rollers generates a relative movement between wire sections and workpiece. A wire saw additionally has a feeding apparatus, on which the workpiece is secured via a sawing bar and which feeds the workpiece to the wire web perpendicularly. The relative movement and the presence of an abrasive cutting agent generate removal of material from the workpiece when the workpiece and wire web come into contact. As feeding continues, the wire sections form cutting kerfs in the workpiece, and the wire web slowly works through the entire workpiece until the wire web comes to lie completely within the sawing bar, with which the workpiece is connected by means of a bondline. The workpiece has then been cut up completely into wafers, which hang from the sawing bar lie teeth of a comb, held only by the bondline.

Multi-wire slicing may be distinguished as either slurry wire slicing or diamond wire slicing. With slurry wire slicing, the wire is initially free from abrasives, and the cutting agent is supplied in the form of a slurry, as freely movable grit, in a carrier fluid. Slurry wire slicing is therefore characterized by a three-body interaction between the wire, the cutting agent in the slurry and the workpiece. With diamond wire slicing, abrasive cutting agents are anchored in the surface of the wire, and a cutting fluid is supplied which acts as a cooling lubricant. Diamond wire slicing is characterized by a two-body interaction between the cutting agent in the wire surface and the workpiece.

The wire consists usually of hypereutectic pearlitic steel (piano wire) and is usually coated with a thin layer of brass or zinc, the ductility of which ensures solid-state lubrication during wire manufacture by means of drawing through dies, and which acts to protect against corrosion during multi-wire slicing. In the case of slurry wire slicing, the cutting agent consists usually of silicon carbide (SiC) and the carrier fluid usually of oil or glycol. In the case of diamond wire slicing, the cutting agent consists usually of diamonds fixed in the surface of the wire, by means, for example, of synthetic resin, or by electroplating in a bed of nickel, or pressed form-fittingly into the surface. The cooling lubricant is usually water, optionally furnished with additives (wetting agents, anticorrosion agents, defoamers). The wire is typically unwound from a fresh wire coil and supplied to the wire-guiding rollers, and after multi-wire slicing is wound up onto an outgoing wire coil.

Diamond wire slicing employs smooth wire, while slurry wire slicing employs smooth wire or structured wire. Smooth wire possesses the form of a circular cylinder at very great height, this being the length of the wire, with the wire diameter corresponding to the diameter of the cylinder. Structured wire comprises a smooth wire which in directions perpendicular to the longitudinal wire direction has been provided with a multiplicity of protrusions and indentations along its entire length. The surface of a structured wire has recesses and elevations, which act like pockets in which slurry is able to accumulate on the wire, without being stripped off when the wire enters the slicing kerf or being stripped off by the slicing kerf when the wire is moving. Structured wire enables particularly rapid and low-force multi-wire slicing. An example of a structured wire is described by WO 2006/067062 A1.

Multi-wire slicing may take place with unidirectional or reciprocal wire movement. In the case of unidirectional multi-wire slicing, the sawing wire is moved in a longitudinal wire direction from the fresh wire coil to the outgoing wire coil over the entire duration of the slicing process. In the case of multi-wire slicing with reciprocal (bidirectional) wire movement, the sawing wire is moved during the removal process by means of at least one pair of directional reversals, with a pair of directional reversals comprising a first moving of the wire in a first longitudinal wire direction by a first length, and a second moving of the wire in a second direction, exactly opposite to the first direction, by a second length. More particularly, multi-wire slicing with reciprocal wire movement may comprise a multiplicity of such pairs of directional wire reversals, with the first length being chosen to be greater than the second length, with the overall result that during the slicing process, the wire stock is displaced from the fresh wire coil to the outgoing wire coil. The latter method is referred to as multi-wire slicing in pilgrim mode (wire-reciprocating slicing).

A wafer generated by means of multi-wire slicing has the shape of a cylinder with a low height, this being the thickness of the wafer. The base area of the cylinder forms the back side and the top area the front side of the wafer. Located between front side and back side is the edge of the wafer, as a secondary surface. The periphery of the wafer generally bears a mechanical orientation device in the form of a notch pointing to the center of the wafer. To create this notch, the lateral surface of the cylindrical ingot is provided prior to multi-wire slicing with an indexing notch which is oriented parallel to the ingot axis.

Multi-wire slicing is typically followed by a step of mechanical working whose objective is to remove the surface layers, having undergone crystalline damage as a result of the multi-wire slicing, from the wafers; to further reduce deviations from the desired, extremely plane-parallel form of the wafers, by removing material; and to generate a wafer surface which has a low roughness and a relatively low degree of residual crystalline damage. A particular working step contemplated is that of simultaneous double-disk grinding (DDG).

DE 101 42 400 B4 describes, for example, an operating sequence for the machining of semiconductor wafers, comprising the separation of a workpiece into wafers (step 1), the rounding of the edge of the wafers (step 2), the simultaneous double-disk grinding (step 3), the polishing of the wafers (step 4), and optionally, in addition, between step 3 and step 4, the etching of at least one of the two main surfaces of the wafers.

Double-disk grinding and an apparatus suitable for it are described for example in EP 1 193 029 B1. In DDG, two cup grinding wheels are disposed with axes collinear to one another and parallel to the axis of the wafer. On their end faces, the cup grinding wheels carry a ring of grinding teeth which incorporate diamond abrasive. One cup grinding wheel faces the front side and the other the back side of the wafer. The cup grinding wheels rotate in opposite directions to one another. Their diameter in each case is somewhat larger than the radius of the wafer. The axes of the grinding wheels are shifted parallel to the wafer axis by the amount of the radius of the annular grinding-wheel covering, so that the outer periphery of the teeth of the grinding wheels covers the center of the wafer in each case. The wafer is guided radially by means of a guide ring, which rotates about the wafer axis. The guide ring contains a notch finger which engages into the indexing notch of the wafer and so transmits the rotation of the guide ring to the wafer.

In the axial direction the wafer is guided hydrostatically between two hydro pads. The axial forces of the two hydro pads compensate one another exactly in the center plane between the two hydro pads. A planar wafer whose front side and back side do not protrude substantially out of this center plane between the two hydro pads is guided axially forcelessly, "free floating" so to speak. An uneven, corrugated or curved wafer protruding over part of its area out of the center plane between the hydro pads is subject locally to axial forces which cause elastic deformation of the wafer during DDG machining.

By symmetrical feeding of the cup grinding wheels onto the center plane between the hydro pads, the cup grinding wheels are brought into contact with the wafer (grinding wheel touch-down). By continued symmetrical feeding, and by means of the relative movement, the abrasive of the grinding teeth of the cup grinding wheels then carries out simultaneous, approximately symmetrical removal of material from the front and back sides of the wafer. Because at any point in time the grinding wheels cover only a part of the wafer surface, and the entire main surfaces of the wafer are captured only gradually by the rotation of the wafer, the continual feeding of the grinding wheels initially produces an approximately symmetrical decrease in wafer thickness in a helix shape. The centering of the wafer between the hydro pads, and the wafer thickness achieved, are verified continually during grinding detrition, using distance measuring sensors. When a preselected target wafer thickness is reached, the further feeding of the cup grinding disks is ended, and the wafer is rotated through by a number of further rotations under the cup grinding disks, which continue to rotate; during this procedure, the feed forces of the cup grinding disks are dissipated and the cup grinding disks are removed from material-removing engagement (spark out). It is only this sparking out which gives the wafers their plane-parallel form.

Wafers machined by DDG have a characteristic cross-grinding. The collinearity of the axes of the grinding wheels and also the degree of plane-parallelism of the wafer can be assessed on the basis of the uniformity of this cross-grinding and adjusted by adapting the axial inclination to one another in the region of a few angular seconds.

The geometry of a wafer, in other words its appearance in space, can always be described completely by its thickness and shape. If the distance is measured at points between the back side and the front side of a wafer, the distances form the height of an area which describes the thickness. From the thickness it is possible to derive thickness-related characteristic variables, examples being TTV (total thickness variation) or GBIR (global back-referenced indicator reading). The shape of a wafer is described by the median surface. The median surface is the area which contains all neutral fibers of the force-free wafer. A neutral fiber is that fiber or layer of a bar cross-section whose length does not change when the bar is flexed or twisted. More particularly the neutral fiber is the location at which tensile stress and compressive stress balance each other exactly under flexing or twisting. From the shape it is possible to derive shape-related characteristic variables, examples being the warp, as the difference between the greatest and least deviation of the median surface from the regression plane, or the bow, as the deviation of the vertex of the compensating rotational paraboloid of the median surface from the regression plane (with sign), or the waviness, as a spatially high pass-filtered reproduction of the median surface. An unambiguous waviness profile therefore always requires the statement of the spatial limiting frequency, quality and filter order with which the spatial low pass filtering is performed. The regression plane is formed according to the method of least squares.

Both with slurry wire slicing and with diamond wire slicing, the respective removal of material is subject to local statistical distribution according to removal rate, roughness generated, and surface damage. The major surfaces of the wafers formed by the slicing process therefore have surface defects distributed differently, statistically by frequency, depth and nature, in locations corresponding to one another on front side and back side of the wafers. Each defect is the origin of a strain. This topic is also addressed, for example, in JP 08 274 050 A. Different stresses of corresponding regions in front side and back side of the wafers lead to resultant, remanent lateral shear stresses in the wafer surface, which cause elastic curvature of the wafer. This elastic deformation of the wafer is referred to as strain-induced warpage.

At the end of machining, front side and back side of a wafer, which is elastically curved at the start of DDG machining, are indeed plane-parallel to one another at the end of the machining; however, the wafer remains elastically stressed. The wafer relaxes after removal from the hydro pads, at which point it does have a homogeneous thickness, but also has a nonplanar shape. Such wafers are unsuitable for demanding applications.

The flatness of a wafer also suffers as a result of differences in the structural nature (roughness) and/or crystalline nature (cracks, mosaics, dislocations) between front side and back side. The differences lead to differences in removal of material during DDG machining, with the result that during grinding, the wafer is pressed out axially from the median surface between the hydro pads on one side and is therefore no longer machined in a manner free from constraining forces axially.

A variety of operating sequences are known, aimed at providing wafers having an extremely flat form. US 2002/0016072 A1 and U.S. Pat. No. 6,376,395 B2 describe sequences which also include simultaneous double-sided lapping. The additional lapping renders these sequences uneconomic.

U.S. Pat. Nos. 6,491,836 B1, 6,376,335 B1 and 6,066,565 describe similarly uneconomic sequences.

US 2006/0252272 A1 describes an operating sequence comprising (a) sawing, (b) edge rounding and (c) lapping, with the wafer being cleaned with alkali after the edge rounding.

There is a general distinction to be made between cleaning and etching: cleaning removes foreign substances from the workpiece surface, without itself damaging or modifying the workpiece surface. In the case of cleaning, therefore, there is no removal of material from the workpiece itself and, in particular, the thickness and shape of the workpiece are not altered. In the case of etching, conversely, there is removal of material from the workpiece.

US 2009/0203212 A1 describes an operating sequence composed of sawing and grinding, where cleaning is performed before grinding, with the intention of removing heavy metals from the surface of the sawn wafer. Also proposed for this purpose is an RCA SC1 cleaning with ammonia ($NH_4OH$) and hydrogen peroxide ($H_2O_2$) at elevated temperature (60° C. to 90° C.).

SUMMARY

In an embodiment, the present disclosure provides a method that produces wafers from a cylindrical ingot of semiconductor material having an axis and an indexing notch in an outer surface of the cylindrical ingot and parallel to the axis. The method includes, in the order specified: (a) simultaneous removal of a multiplicity of sliced wafers from the cylindrical ingot by multi-wire slicing in the presence of a cutting agent; (b) etching of the sliced wafers with an alkaline etchant in an etching bath at a temperature of 20° C. to 50° C. and for a residence time, such that the material removed from each of the sliced wafers is less than $5/1000$ of an initial wafer thickness; and (c) grinding of the etched wafers by simultaneous double-disk grinding using an annular abrasive covering.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Aspects of the present disclosure provide a method that yields wafers having a particularly high degree of plane-parallelism of their front and back sides and a low level of crystalline and structural defects at their surfaces, which is advantageously economically efficient.

An aspect of the present disclosure provides a method for producing wafers from a cylindrical ingot of semiconductor material having an axis and an indexing notch in the lateral surface of the ingot and parallel to the axis, comprising in the order specified:

(a) the simultaneous removal of a multiplicity of wafers from the cylindrical ingot by means of multi-wire slicing in the presence of a cutting agent;

(b) the etching of the wafers with an alkaline etchant in an etching bath at a temperature of 20° C. to 50° C. and for a residence time, with the material removed from each of the wafers being less than $5/1000$ of an initial wafer thickness; and (c) the grinding of the wafers by means of simultaneous double-disk grinding with an annular abrasive covering as the tool.

The grinding of the wafers by means of DDG is the first mechanical working of the front and back sides of the wafers after the simultaneous removal of the wafers from the cylindrical ingot.

In multi-wire slicing, wire is guided spirally around at least two cylindrical wire-guiding rollers having axes disposed parallel to one another, in such a way that between two adjacent wire-guiding rollers, a planar web of wire sections extending parallel to one another and perpendicular to the axes of the wire-guiding rollers is formed, this web of wires facing the ingot. By means of a feeding apparatus, the ingot is fed perpendicularly onto the wire web in such a way that it comes into contact with the wire web, and, on continued feeding, the wire sections work through the ingot in a relative movement to the ingot by means of codirectional rotation of the wire-guiding rollers about their axes and in the presence of an abrasive cutting agent, removing material as they do so.

In the case of simultaneous double-disk grinding, the wafer is guided radially in a rotating retaining ring with a notch finger, which engages into the indexing notch in the wafer, and rotated, and also guided axially between two hydro pads. At the same time, contrarotating cup grinding disks which are disposed collinear with one another and have axes parallel to the axis of the wafer, and each have an annular abrasive covering, are fed onto the center plane between the two hydro pads, resulting in simultaneous removal of material from the front and back sides of the wafer.

Etching may be carried out in an etching bath in which one or more of the following compounds are dissolved: potassium hydroxide (KOH), sodium hydroxide (NaOH), ammonium hydroxide ($NH_4OH$) and/or tetramethylammonium hydroxide (TMAH, $N(CH_3)_4OH$). An oxidizing agent, such as hydrogen peroxide, is not a constituent of the alkaline etchant, since it hinders the removal of material from the wafer surface. The concentration of the alkaline etchant may be 0.5 to 10 wt %, preferably 1 to 5 wt %. The temperature may be from 20° C. to 50° C., preferably 25 to 40° C. The residence time of the wafers in the etching bath may be 0.5 min to 15 min, preferably 1 min to 6 min.

The multi-wire slicing may be slurry wire slicing, in which case the wire may consist of hypereutectic steel (piano wire) having a carbon content of 0.8 wt % to 1 wt % and may have a diameter of 50 µm to 175 µm. The abrasive cutting agent is preferably a slurry of silicon carbide (SiC) having a particle size of 7 µm to 13 µm in glycol or oil. The wire may be a smooth wire or a structured wire. The multi-wire slicing may alternatively be performed as diamond wire slicing, in which case the wire used is a hypereutectoid steel wire having a carbon content of 0.8 wt % to 1 wt % and having a diameter of 50 µm to 120 µm. The cutting agent preferably comprises diamonds having a particle size of 4 µm to 20 µm, which are anchored in the surface of the wire, by means, for example, of electroplate binding with nickel, by means of synthetic resin binding or mechanically, as for example by form-fitting pressing/rolling into the surface of the wire.

The multi-wire slicing may take place with unidirectional wire movement or with reversal of the direction of wire movement. Preference is given to multi-wire slicing by the pilgrim mode slicing method (wire-reciprocating slicing), where the wire is moved in a multiplicity of pairs of directional reversals around wire-guiding rollers, and where a pair of directional reversals comprises in each case a moving in a first longitudinal wire direction by a first length and a subsequent moving in a second direction, exactly opposite the first longitudinal wire direction, by a second length, and the first length is chosen to be greater than the second length.

The abrasives in the cup grinding disks in the case of simultaneous double-disk grinding (DDG) may be bonded ceramically, with synthetic resin or metallically. Ceramic bonding is preferred. The mean particle size of the abrasives in the case of DDG may be 0.5 µm to 12 µm, preferably 1.5 µm to 6 µm.

By means of the method of implemented according to aspects of the present disclosure, it is also possible in particular to produce wafers of semiconductor material that satisfy particularly challenging requirements in terms of their shape in space and in relation to the change in shape according to location (waviness). Such wafers include, for example, wafers with a virtually neutral shape.

Figure 1:
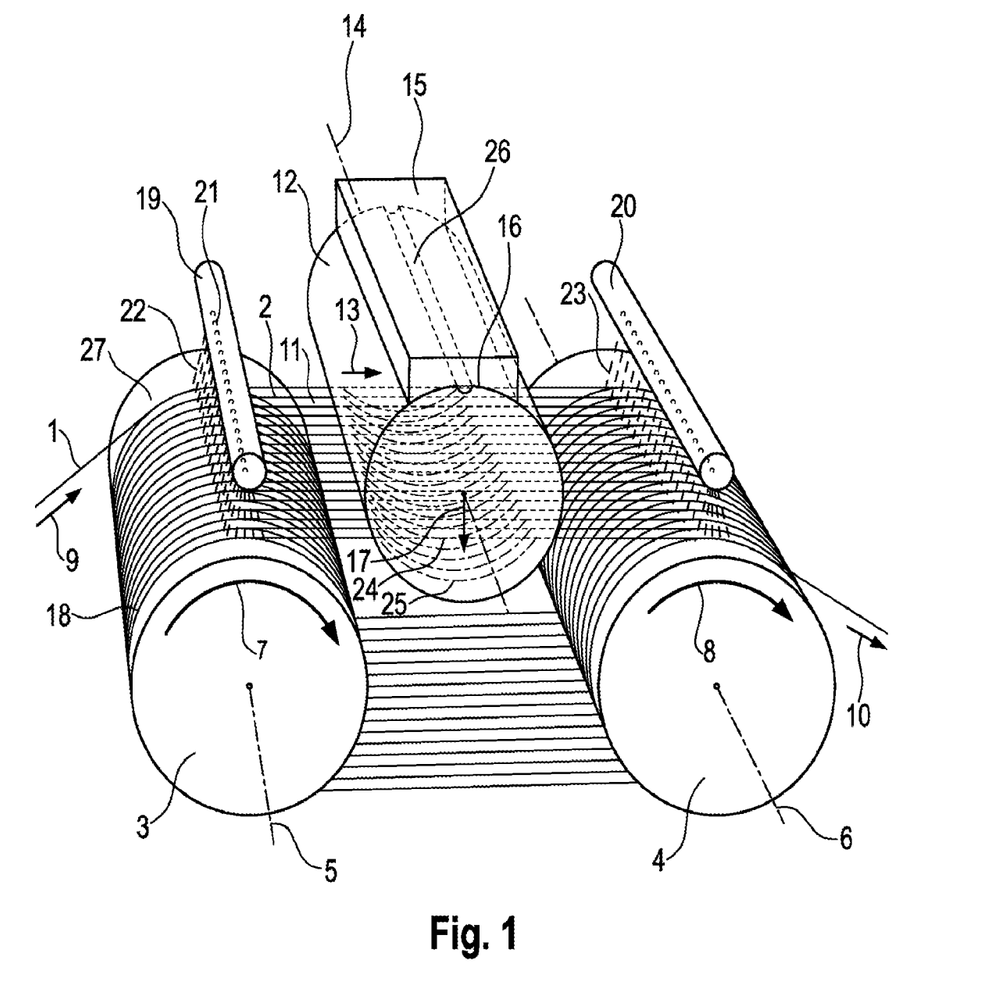
FIG. 1 illustrates elements of a wire saw.

FIG. 1 shows elements of a wire saw that are important in understanding an embodiment of a method of the present disclosure. Wire 1 is supplied from a stock (e.g., fresh wire coil) in movement direction 9 to the web 11 stretched from sections 2 of the wire, extending parallel to one another, between two wire-guiding rollers 3 and 4. The wire web 11 is formed by the wire being guided spirally around the wire-guiding rollers, in grooves 18 in the wear-resistant coating 27. The grooves 18 are each closed and extend parallel and at distances from one another that are substantially constant in pairs, in planes perpendicular to the axes 5 and 6 of the wire-guiding rollers 3 and 4. After passage through the wire web 11, the wire leaves the wire web in movement direction 10 and is supplied to a stock (e.g., used wire coil).

Codirectional rotation 7 and 8 of the wire-guiding rollers 3 and 4 about their axes 5 and 6 moves the wire sections 2 of the wire web 11, which extend parallel to one another in direction 13 relative to the workpiece 12. The workpiece 12, a cylindrical ingot of semiconductor material having an axis 14, is connected to a sawing bar 15 by a bondline 16 and is fed with a feed apparatus onto the wire web in direction 17. The axis 14 and the axes 5 and 6 of left-hand wire-guiding roller 3 and right-hand wire-guiding roller 4 are oriented parallel to one another. In the event that so-called misoriented wafers are required, the axis 14 may also be tilted relative to the axes of the wire-guiding rollers. The workpiece 12 is provided in its lateral surface with an indexing notch 26 which points radially to the axis 14 and extends parallel to the axis 14.

The wire web 11 is subjected to a jet 22 of cutting agent, through exit openings 21 by means of a nozzle 19, on the side of the workpiece 12 on which the web moves in direction 13 onto the workpiece. In the case of multi-wire slicing by the slurry wire slicing method, the wire 1 is a smooth or a structured piano wire whose surface initially itself contains no abrasives, and the cutting agent is a slurry of free abrasives. In the case of multi-wire slicing by the diamond wire slicing method, the wire 1 is a smooth piano wire whose surface contains fixed abrasives as cutting agents, and the jet 22 consists of a cutting fluid, which does not itself contain any abrasives. In the case of multi-wire slicing with bidirectional wire movement, as for example in the pilgrim mode slicing method, the wire is moved reciprocally in direction 13 onto the workpiece. In this case, as well as a nozzle 19, there is also a nozzle 20 lying opposite to the nozzle 19, with the nozzle 20 subjecting the wire web to a jet 23 of cutting agent/cutting fluid. In the case of the pilgrim mode slicing method, the nozzles 19 and 20 may be operated alternately or continuously, depending on the movement direction 13 of the wire web 11. Continuous operation is preferred.

The workpiece is first brought into contact with the wire web, by the feeding of the workpiece 12 in direction 17 perpendicularly onto the wire web 11. With continued feeding of the workpiece, in the presence of cutting agent and with relative movement of the wire sections 2 of the wire web relative to the workpiece, the wire sections remove material from the workpiece 12. Specifically, the feed first produces a slight sagging of the wire sections in feed direction 17, and so the resilience forces resulting from the elasticity of the wire exert a force of the wire sections opposite the feed direction on the primary cutting area 24. This force causes the abrasive solids located between wire and workpiece to penetrate the workpiece material, and the relative movement between wire and workpiece then detaches cut material from the workpiece material and therefore results in removal of material. In this way, each wire section forms a slicing kerf 25. The slicing procedure is at an end when the wire web 11 has worked completely through the workpiece 12 and has come to lie completely in the sawing bar 15. The distance between the point of first contact of the wire web with the workpiece (cut-in) and the principal cutting area 24 is referred to as the depth of cut.

After the multi-wire slicing, the resulting wafers are separated from remnants of the sawing bar 15 and of the bondline 16.

Figure 2:
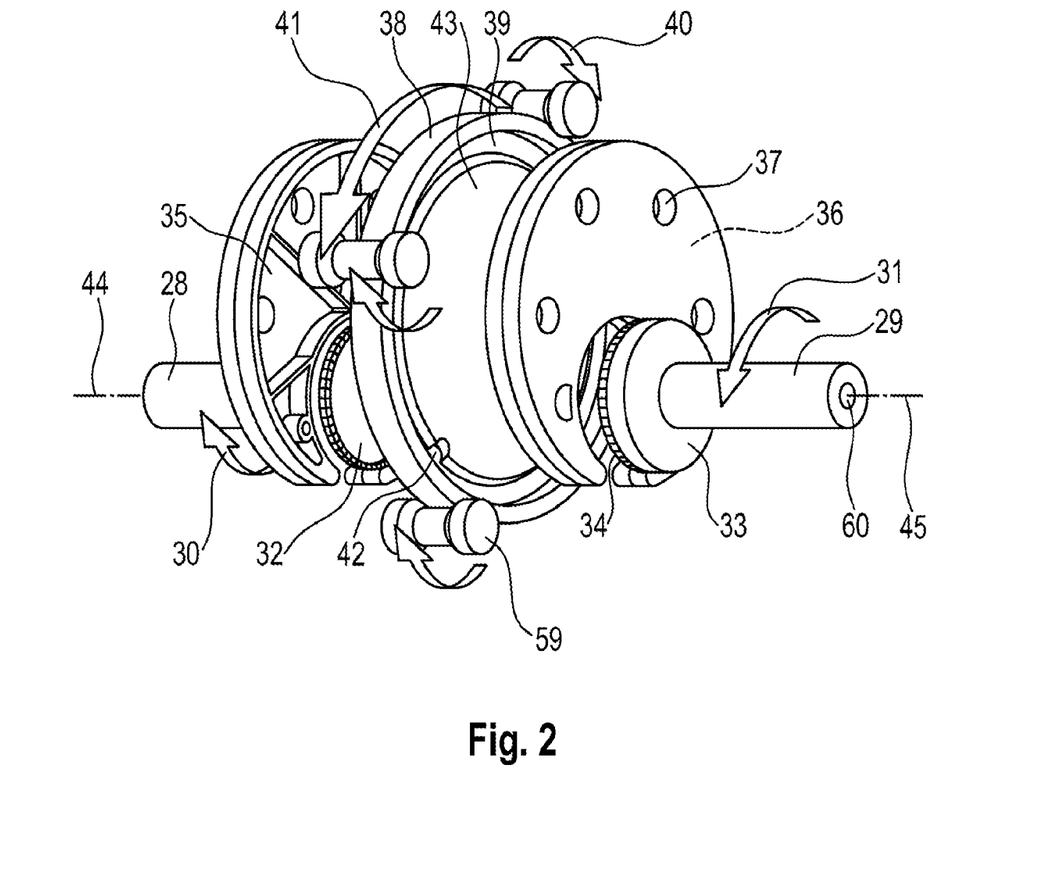
FIG. 2 illustrates elements of an apparatus for simultaneous double-disk grinding.

FIG. 2 shows elements of an apparatus for simultaneous double-disk grinding (DDG) in an exploded representation. The wafer 43 for working lies in a carrier ring 38 as a receiver. Clamped in the carrier ring 38 is a guide ring 39, the thickness of which is less than the target thickness of the wafer after DDG working. The guide ring has a notch finger 42, which engages into the indexing notch of the wafer 43. The carrier ring 38 is guided radially by rollers 59, which rotate in direction 40 and so place the carrier ring 38 into rotation 41 about its center axis. The notch finger 42 transmits this rotation 41, via the indexing notch, to the wafer. The wafer 43 is inserted loosely, with a radial play, into the guide ring 39 of the carrier ring 38, so that no radial compulsive forces are exerted on the wafer that might cause elastic deformation of the wafer. Left-hand 28 and right-hand 29 grinding spindles, the axes 44 and 45 of which are collinear with one another and oriented parallel to the center axis of the wafer, carry a left-hand 32 and a right-hand 33 cup grinding disk, each with a ring of grinding teeth 34, of which one faces the front side and the other the back side of the wafer 43. The axes 44 and 45 of the spindles are displaced by the amount of the outer radius of the rings of grinding teeth 43 with respect to the center axis of the wafer 43, such that the outside edge of the grinding tooth ring passes through the center axis of the wafer.

Axially, the wafer 43 is mounted hydrostatically between two hydro pads 35 and 36, with one facing the front side and the other the back side of the wafer. Provided the median surface of the wafer is approximately identical to the regression plane thereof, i.e. provided the wafer has no severe curvature or waviness, the median surface therefore extends coplanarly to the center plane between the hydro pads. The hydro pads in that case do not exert any axial compulsive forces on the wafer, and the wafer is not elastically deformed axially. For DDG working, the rotating grinding spindles 28 and 29 are fed symmetrically, with continued rotation of the wafer by the driven guide ring 39, onto the center plane between the hydro pads 35 and 36 and therefore symmetrically onto the median surface of the wafer 43, and so the grinding teeth 34, when the cup grinding wheels make contact with the wafer, remove material from the wafer 43 simultaneously on either side. Water is supplied to the hydro pads from the respective back side 37 of the hydro pads.

At first contact of the cup grinding wheels with the wafer, the cup grinding wheels first generate an annular removal of material from the wafer, with this annular removal extending from the wafer center to the wafer edge. The diameter of the cup grinding wheels is somewhat greater than the radius of the wafer, and so the cup grinding wheels extend some way beyond the edge of the wafer, allowing the material removed to be taken off from the material removal zone. The grinding spindles are configured as hollow spindles. By means of two rotary liquid passages, the cup grinding wheels are supplied with water through the bores 60 in the hollow spindles, this water, as a cooling lubricant, cooling the material-removing grinding teeth 34 and transporting off the material removed from the wafer. DDG is what is called a subaperture method, since at each point in time the tool covers only part of the wafer surface. Only by rotation of the wafer, by means of the carrier ring, between the cup grinding disks is, in succession, the entire wafer surface covered and worked on. Since the wafer surface is accessible during working, the instantaneous thickness of the wafer 43 may be measured continually in situ by means, for example, of a double-sided gauge (caliper gauge) engaging at the outer periphery of the wafer.

When a target thickness has been reached, the double-sided gauge is swiveled away, the further feeding of the grinding spindles is ended, and the wafer is rotated through with the cup grinding disks continuing to rotate. This converts the removal of material running spirally around the wafer and extending axially into the wafer into a removal of material which is planar for the entire surface of the wafer. The shear forces arising from the spindle feeding, which are necessary for material-removing engagement into the workpiece, are slowly dissipated, and the abrasive grains of the cup grinding disks, consisting of diamonds, disengage from the workpiece. This procedure is referred to as spark out. Any tracks left by the double-sided gauge are also eliminated in this procedure. Because, at the end of spark out, the cup grinding wheels lie flatly on the then planar surface of the wafer, with the entire circumference of their grinding tooth rings, a cross-grinding pattern is formed on both sides of the wafer.

Aspects of the present disclosure relate to a series of observations and trials, which are set out below:

Firstly, it was observed, by elemental analysis, that the surface of wafers made of monocrystalline silicon exhibits, after slurry wire slicing, a concentration of copper resulting from the abrasion of the brass coating on the sawing wire, this concentration significantly exceeding the maximum volume solubility of copper in monocrystalline silicon at room temperature. A depth profile analysis showed that the copper is present only in a layer a few micrometers thick. From the fact that it was not possible to detect any increased copper concentration in the volume lying under the damaged surface of the wafer, after multi-wire slicing, the present inventors concluded that the damaged surface of the wire-sawn wafer acts as a getter, which reduces the mobility of the copper and prevents penetration into the wafer volume with undamaged crystallinity.

Secondly, it was observed that the warp immediately after multi-wire slicing is substantially greater than the sum total of the warp after further material-removing working and the degree of warp reduction, known from experience, as a result of this material-removing working. It was concluded from this that immediately after multi-wire slicing, the wafer, in addition to its plastic deformation as a result of uneven cut profiles, has a large proportion of elastic deformation, which is caused by asymmetric front-side/back-side roughness or crystalline damage. The entirety of all of the near-surface crystal disruptions is referred to as sub-surface damage. The elastically strain-induced warping due to sub-surface damage is also called strain-induced warpage.

For further material-removing working, a 2-minute etch in 4 wt % potassium hydroxide solution at 40° C. was chosen. The removal of material was determined from the difference between the weight of the wafer before and after etch removal, on a precision balance, and resulted in a plausible decrease in thickness as a result of the etch treatment.

Thirdly, an increased copper concentration in the volume of etched wafers was observed when the damaged surface layer—which prevents the penetration of copper into the volume and acts as a getter—had been largely removed.

Fourthly, it was observed that the elastically strain-induced warpage could be reduced substantially even at very low levels of etch removal. Conditions were determined for the removal of material, which allowed the elastically strain-induced warpage due to multi-wire slicing to be effectively eliminated, without fully removing the remaining, still damaged layer preventing penetration of copper into the volume of the semiconductor wafer.

Fifthly, it was observed that a wafer of reduced warpage by etching under these conditions has a substantially lower warp, after subsequent DDG working, than a wafer which has not been etched. For this purpose, wafers from the same multi-wire slicing run, having substantially the same warp levels as sliced, were either etched or left untreated, followed by DDG grinding and renewed measurement of the warp.

Figure 3:
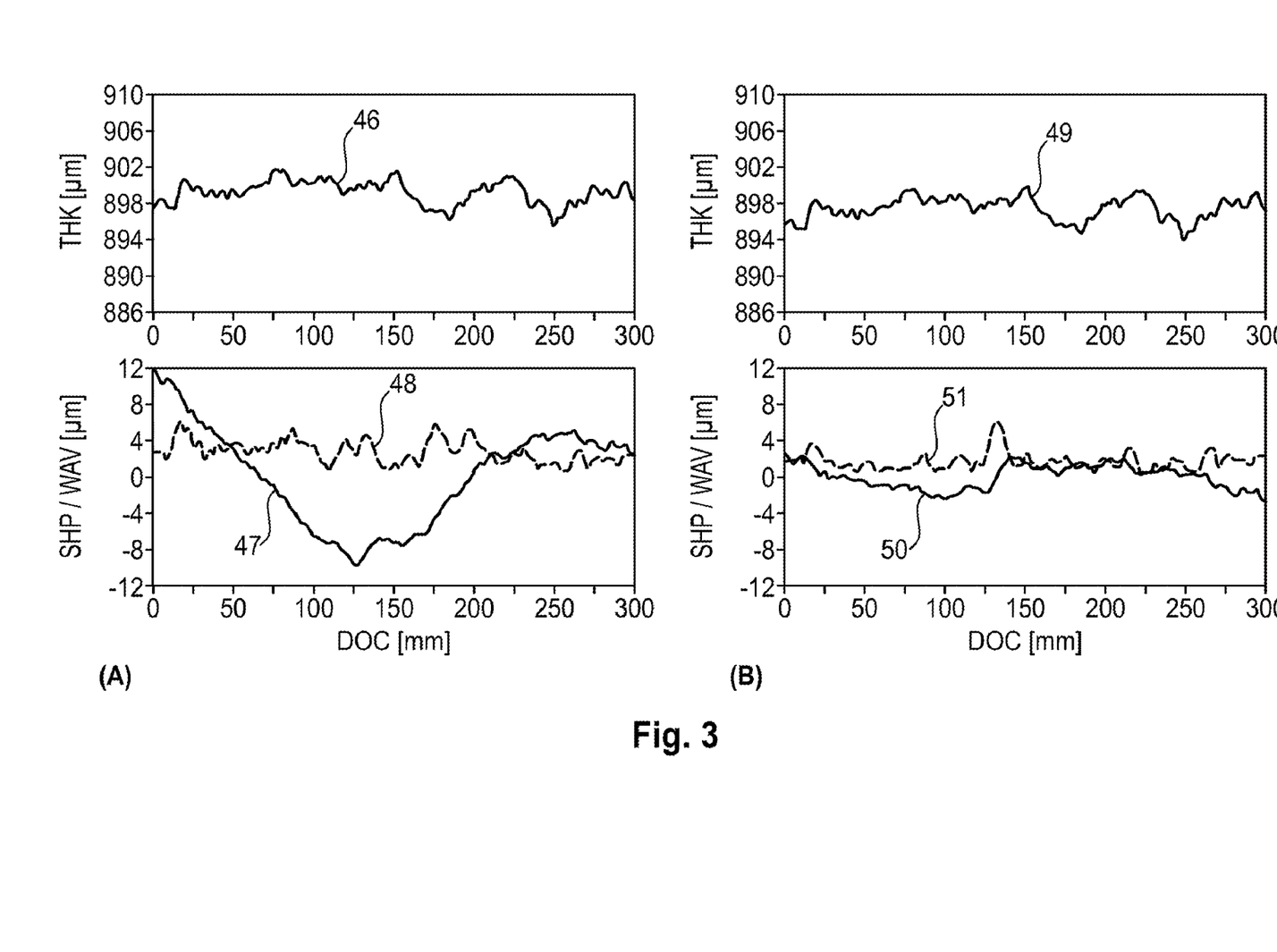
FIG. 3 provides a diagram with thickness and shape and waviness profile of a wafer.

FIG. 3 provides a diagram with thickness and shape and waviness profile of a wafer, where side (A) shows a comparative example: after multi-wire slicing (without etching), and side (B) shows an example according to aspects of the present disclosure, after multi-wire slicing and subsequent etching.

FIG. 3 shows the thickness profile 46 and 49 (upper diagrams, THK=thickness) and the shape profile 47 and 50 (lower diagrams, SHP=shape) of a 300 mm wafer after slurry wire slicing over the depth of cut, (A) before and (B) after etching (identical wafer). Prior to the etching, the wafer has a significantly warped shape profile 47 along a linear scan in cutting direction. The linear shape range (LSR, minimum to maximum of the deformation) is about 22 µm. After etching, the LSR has dropped to about 4 µm, in accordance with the shape profile 50. The difference between thickness profiles 46 and 49 corresponds to the removal of 1-2 µm of material. The total thickness of the wafer was on average 895 µm. The relative decrease in thickness, accordingly, was only 1.5/895≈1.7‰. Etching took place by 4-minute immersion of the wafer in 4 wt % potassium hydroxide solution at 40° C. During the first 30 s there was no significant removal of material observed (no formation of $H_2$ gas bubbles), since initially native oxide is removed at a relatively low etch rate. A desired removal of material may be established with precision by means of the concentration of the etchant, the temperature of the etching bath, and the residence time of the wafer in the etching bath.

FIG. 3 also shows the waviness profile 48 and 51 (lower diagrams, WAV=waviness) of the wafer immediately after slurry wire slicing (A) and after additional etch treatment (B). The waviness WAV was ascertained by determining, for each depth of cut (DOC), the difference between maximum and minimum of the respective shape profile within a measuring window 10 mm long along the depth of cut, and plotting the results as waviness WAV=|f(SHP)|against the starting point of the measurement window on the depth-of-cut axis. For a width of the region that goes toward zero (instead of 10 mm), in which the difference between max and min is determined, the waviness WAV would correspond to the first derivation of the shape profile according to position. The specified measurement protocol for the waviness WAV corresponds to a spatial highpass filtering of the shape profile with a spatial corner frequency f0=1/10 mm. Since WAV in the positional space is ascertained using "boxcar averaging" (hard cut-off of the external values), it corresponds in the (positional) frequency space to a comb filter of very high quality and order. (If, additionally, values outside the boxcar limits are taken into account with decreasing weighting, the filter order and filter quality are reduced depending on the function with which this decreasing weighting of out-of-band values is performed.)

Irrespective of the etching of the wafer in accordance with an aspect of the present disclosure before it is worked on by DDG, the surface layer with crystalline damage following multi-wire slicing ought to be retained insofar as the getter effect that still exists effectively prevents diffusion of copper into the volume of the wafer. This may be considered to apply if the removal is not more than 5/1000 of the original thickness, which, for a thickness of 895 µm, corresponds to material removal of 4.5 µm. The etch removal, on the other hand, ought also to be high enough to compensate for the elastic warpage of the wafer as a result of local front-side/back-side asymmetries in the roughness, and the degree and the depth of the crystalline damage.

The thickness and nature (stoichiometric, density) of the native oxide and hence the precise duration of the initial etching phase are dependent on the precise waiting time between slicing, i.e., the generation of the surface of the wafer, and etching, on the ambient conditions prevailing in these operations (temperature, atmospheric humidity), on the degree of the damage (warpage of the silicon crystal lattice), and on the doping (shielding of the charge distribution of the silicon bonds) and amounts at maximum to about 2 nm. The wafers ought preferably to be etched uniformly over their entire surface—in other words, the time for immersion into the etch and for removal from the etch ought to be extremely short relative to the overall residence time in the etch. The removal of material achieved by the etching of the wafers with the alkaline etchant is preferably at least 0.3 µm per wafer, preferably at least 0.5 µm per wafer. For certain wafers with elastic warpage-induced deformation, just 0.5 µm material removed was enough to achieve substantial elastic relaxation.

On account of the diffusion rate of impurities, especially of copper, that increases with temperature in the solid silicon body, the temperature of the etching bath ought not to be more than 50° C.

Sixthly, it was observed that etching with alkaline etchant, potassium hydroxide for example, is more suitable than etching with acidic etchant, nitric acid for example. The etching with alkaline etchant is anisotropic; the etching with acidic etchant is isotropic. The etching with alkaline etchant generates small four-sided pyramids on silicon surfaces with (100) orientation, and these pyramids roughen the surface of a wafer and provide it to the DDG grinding wheel as a reproducible surface for engagement.

Seventhly, it was observed that during the grinding of a wafer by means of DDG, the cup grinding wheels generally bring about asymmetric removal of material from the front and back sides of the wafer if etching with alkaline etchant is not carried out beforehand. The asymmetry may be so pronounced that only one grinding wheel brings about removal, while the opposite grinding wheel glides over the surface of the wafer with virtually no removal. The degree of asymmetry in the removal of material may be observed, for example, by grinding wafers with laser marking once on the front side and once on the back side, by turning over the wafer in between, by means of DDG. If the laser marking has been made as a deep mark, the depth of the points in the laser marking is about 100 µm, and therefore deeper than the removal of material of 70 µm, for example, which comes about in total on both sides during DDG grinding. This makes the depth measurement of the laser marking points highly suitable for a side-resolved measurement of the removal of material. In the case of the chosen grinding disks and kinematic parameters of the DDG grinding, without prior etching with alkaline etchant, an asymmetry was found in the front-side to back-side removal of material, in relation to the fraction of the total removal of material, of 20% to 100% (only one side is subject to removal).

A portion of the asymmetric removal of material can also be assigned to the kinematics associated with DDG. The sharpening of the grinding wheels as a result of continuous wear during the grinding procedure is slightly asymmetric, for kinematic reasons. The cup grinding disks rotate in opposite directions (rotational directions 30 and 31 in FIG. 2), and the grinding wheel which grinds inwardly via the edge of the wafer to the center (the left-hand grinding wheel 32 in FIG. 2, with rotational direction 30) undergoes greater sharpening, owing to higher wear, since it runs against the sharp wafer edge, with abrasive grit breaking out of the grinding wheel binding, and generates a higher removal of material from the wafer than the grinding wheel which grinds outwardly toward the edge of the wafer (the right-hand grinding wheel 33 in FIG. 2, with rotational direction 31). This phenomenon can be compensated, however, by feeding the spindles not entirely symmetrically onto the center plane of the hydro pads, but instead feeding them onto a plane shifted parallel to the center plane by the amount of the predetermined difference in the wear of the two cup grinding disks axially in the direction of the outwardly grinding grinding wheel.

An asymmetric removal of material may also be read off from the power consumption of the inverters that is used in order to maintain the preselected rotational speed of the grinding disks. Here, a lower power consumption (lower spindle current) corresponds to a more willingly grinding grinding wheel, and a higher power consumption (higher spindle current) corresponds to a less readily grinding, blunt grinding wheel.

Figure 4:
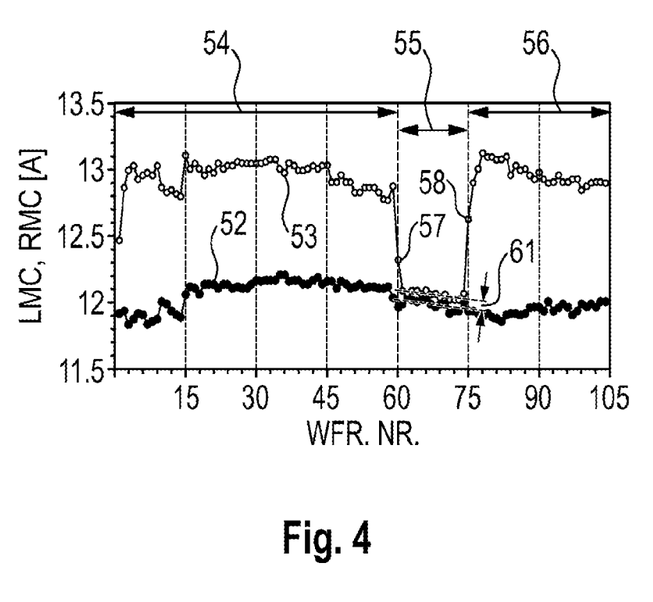
FIG. 4 provides a diagram of the maximum spindle currents during DDG working of wafers.

FIG. 4 shows curves 52 and 53 of the maximum current consumption (in amperes) during the DDG grinding of a series of wafers. The curve 52 (LMC, left max current) is assigned to the left-hand spindle with outwardly grinding grinding wheel, the curve 53 (RMC, right max current) to the right-hand spindle with inwardly grinding grinding wheel. The abscissa shows the serial numbering of the ground wafers. In the region 54, in a first comparative example, wafers were first ground which had not been etched after slurry wire slicing; then, in a first example in the region 55, wafers which had been etched in accordance with aspects of the present disclosure after slurry wire slicing were ground; and lastly, again, in the region 56, wafers which in a second comparative example have not been etched were ground. In the regions 54 and 56, the spindle currents differ greatly, the grinding disks have different sharpnesses and readinesses for cutting, and the resulting rates of removal of material from the wafers on front and back sides are greatly different, with the result of an uneven shape of the wafers after DDG working.

In the region 55, which represents a procedure implemented according to aspects of the present disclosure, the spindle currents are almost compensated; both grinding wheels have approximately the same sharpness and readiness to cut; and the resulting removal of material on both sides of the wafers is largely symmetrical. The remaining slight difference 61 in the spindle currents corresponds to the amount anticipated on the basis of the kinematics of the DDG grinding. The rotary spindle speed was 6000/min, the rotary wafer speed 35/min. This slight difference can still be compensated by a slight increase in the rotary speed of the spindle with outwardly grinding grinding wheel relative to the rotary speed of the other spindle.

The points 57 and 58 of the spindle currents on changeover from unetched to etched wafers and back again from etched to unetched wafers show the effect of the initial sharpening of the first engagement of the grinding disks into the wafer surface. The initial sharpening of the cup grinding disks on each "touch-down" (first contact between cup grinding disk and wafer surface) is different for the cup grinding disks when the natures of the front and back sides of the wafer are different, and the cup grinding disk with less initial sharpening becomes clogged more quickly and becomes blunt more quickly. The etching of the surface of the wafer after multi-wire slicing homogenizes the previously asymmetrically damaged front and back sides of the wafers and provides them with a uniform morphology, which allows symmetrical, balanced grinding by both cup grinding disks. The changeover here takes place within the DDG grinding in each case on only one wafer.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS AND ABBREVIATIONS

1 Wire
2 Wire section
3 Left-hand wire-guiding roller
4 Right-hand wire-guiding roller
5 Axis of the left-hand wire-guiding roller
6 Axis of the right-hand wire-guiding roller
7 Rotational direction of the left-hand wire-guiding roller
8 Rotational direction of the right-hand wire-guiding roller
9 Wire feed
10 Wire takeoff
11 Wire web
12 Workpiece
13 Movement of wire web
14 Axis of workpiece
15 Sawing bar
16 Bondline
17 Direction of feeding of workpiece to wire web
18 Groove
19 Left-hand cutting fluid nozzle
20 Right-hand cutting fluid nozzle
21 Exit openings for cutting fluid
22 Left-hand jet
23 Right-hand jet
24 Primary cutting area
25 Slicing kerf
26 Indexing notch
27 Wear-resistant coating
28 Left-hand grinding spindle
29 Right-hand grinding spindle
30 Rotational direction of left-hand spindle
31 Rotational direction of right-hand spindle
32 Left-hand cup grinding wheel
33 Right-hand cup grinding wheel
34 Grinding teeth
35 Left-hand hydro pad
36 Right-hand hydro pad
37 Back side
38 Carrier ring 39 Guide ring
40 Rotational direction of carrier ring drive
41 Rotational direction of carrier ring
42 Notch finger
43 Wafer
44 Left-hand spindle axis
45 Right-hand spindle axis
46 Thickness profile
47 Shape profile
48 Profile of wafer waviness over the cutting depth after multi-wire slicing
49 Thickness profile
50 Shape profile
51 Waviness profile
52 Curve
53 Curve
54 Region
55 Region
56 Region
57 Point
58 Point
59 Drive rollers for carrier ring
60 Bore in hollow spindle
61 Difference
DDG Simultaneous double-disk grinding
DMWS Diamond wire MWS
DOC Depth of cut
ETCH Etching (alkaline or acidic)
LMC Maximum current consumption of left-hand grinding spindle (left max current)
MWS Multi-wire slicing
RMC Maximum current consumption of right-hand grinding spindle (right max current)
SHP Form (SHaPe) of wafer
SMWS Slurry MWS
THK Thickness (THicKness) of wafer
WAV Waviness (WAViness) of wafer

The invention claimed is:

1. A method for producing wafers from a cylindrical ingot of semiconductor material having an axis and an indexing notch in an outer surface of the cylindrical ingot and parallel to the axis, the method comprising, in the order specified:
    (a) simultaneous removal of a multiplicity of sliced wafers from the cylindrical ingot by multi-wire slicing in the presence of a cutting agent;
    (b) etching of the sliced wafers with an alkaline etchant in an etching bath at a temperature of 20° C. to 50° C. and for a residence time, such that a material removed from each of the sliced wafers is less than 5/1000 of an initial wafer thickness; and
    (c) grinding of the etched wafers by simultaneous double-disk grinding using an annular abrasive covering.

2. The method as claimed in claim 1, wherein the alkaline etchant is a hydroxide of an alkali metal or of a nonmetallic cation that is dissolved in the etching bath.

3. The method as claimed in claim 1, wherein the alkaline etchant comprises potassium hydroxide (KOH), sodium hydroxide (NaOH), ammonium hydroxide ($NH_4OH$) or tetramethylammonium hydroxide (TMAH, $N(CH_3)_4OH$), or a mixture of at least two of these compounds.

4. The method as claimed in claim 1, wherein the residence time of the wafers is 0.5 min to 15 min.

5. The method as claimed in claim 1, wherein a concentration of the alkaline etchant in the etching bath is 0.5 to 10 wt % and the material removed per wafer is not more than 4.5 µm.

6. The method as claimed in claim 4, wherein the temperature is 25° C. to 40° C., the residence time is 1 min to 6 min, and the concentration of the alkaline etchant in the etching bath is 2 wt % to 6 wt %.

7. The method as claimed in claim 1, wherein the multi-wire slicing is performed as slurry wire slicing, wherein wire used in the slurry wire slicing is a hypereutectoid steel wire having a carbon content of 0.8 wt % to 1 wt % and a diameter of 50 µm to 175 µm, and the cutting agent is a slurry of silicon carbide (SiC) having a particle size of 7 µm to 13 µm in glycol.

8. The method as claimed in claim 7, wherein the wire is structured and bears a multiplicity of indentations and protrusions in directions perpendicular to a wire axis.

9. The method as claimed in claim 1, wherein the multi-wire slicing is performed as diamond wire slicing, wherein wire used in the diamond wire slicing is a hypereutectoid steel wire having a carbon content of 0.8 wt % to 1 wt % and having a diameter of 50 µm to 120 µm, wherein the cutting agent comprises diamonds with a particle size of 4 µm and 20 µm, and wherein the diamonds are anchored in a surface of the wire by electroplate binding with nickel, by synthetic resin binding, or by mechanically anchoring.

10. The method as claimed in claim 1, wherein during the multi-wire slicing wire is moved in a multiplicity of pairs of directional reversals around wire-guiding rollers, each of the pairs of directional reversals comprises in each case a moving in a first longitudinal wire direction by a first length and a subsequent moving in a second direction, exactly opposite to the first longitudinal wire direction, by a second length, and the first length is chosen to be greater than the second length.

11. The method as claimed in claim 1, wherein the annular abrasive covering comprises diamond which is ceramically bonded and has a particle size of 0.5 µm to 12 µm.

12. The method as claimed in claim 11, wherein the particle size is 1.5 µm to 6 µm.

13. The method as claimed in claim 1, wherein the grinding is the first mechanical working of front and back sides of the wafers after the simultaneous removal of the wafers from the cylindrical ingot.

14. The method as claimed in claim 1, wherein an oxidizing agent is not a constituent of the alkaline etchant.

15. The method as claimed in claim 1, wherein for the etching, the alkaline etchant is a 4 wt % potassium hydroxide solution, the temperature is 40° C., and the residence time is 2 or 4 minutes.

16. The method as claimed in claim 1, wherein the etching is configured for uniform etching over an entire surface of each of the wafers.

* * * * *